United States Patent
Oh et al.

(10) Patent No.: US 8,215,010 B2
(45) Date of Patent: Jul. 10, 2012

(54) METHOD OF MANUFACTURING A PRINTED CIRCUIT BOARD

(75) Inventors: Sung-II Oh, Seoul (KR); Jae-Woo Joung, Suwon-si (KR); Tae-Hoon Kim, Anyang-si (KR); Sung-Nam Cho, Chungcheongnam-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 568 days.

(21) Appl. No.: 12/320,742

(22) Filed: Feb. 3, 2009

(65) Prior Publication Data

US 2009/0277674 A1 Nov. 12, 2009

(30) Foreign Application Priority Data

May 9, 2008 (KR) .................. 10-2008-0043201

(51) Int. Cl.
*H05K 3/02* (2006.01)

(52) U.S. Cl. ................... 29/847; 427/466; 438/677

(58) Field of Classification Search .......... 29/846, 29/847, 851, 852; 156/220, 581; 205/149, 205/164; 264/220, 293; 427/258, 466; 438/670, 438/677, 687
See application file for complete search history.

(56) References Cited

U.S. PATENT DOCUMENTS

| 3,884,771 | A | * | 5/1975 | Hanabusa et al. | 205/164 |
| 6,599,582 | B2 | * | 7/2003 | Kiguchi et al. | 427/466 |
| 7,202,156 | B2 | * | 4/2007 | Saiki et al. | 438/677 |
| 7,404,885 | B2 | * | 7/2008 | Furihata et al. | 205/149 |

FOREIGN PATENT DOCUMENTS

| JP | 3-129894 | 6/1991 |
| JP | 11-87910 | 3/1999 |
| JP | 2000-208936 | 7/2000 |
| JP | 2001-15934 | 1/2001 |
| JP | 2005-191330 | 7/2005 |
| KR | 10-2007-0041953 | 4/2007 |
| KR | 10-2007-0065196 | 6/2007 |

OTHER PUBLICATIONS

Korean Office Action issued on Aug. 26, 2009 in corresponding Korean Patent Application 10-2008-0043201.
Japanese Office Action issued Dec. 21, 2010 in corresponding Japanese Patent Application 2008-321441.

* cited by examiner

*Primary Examiner* — Donghai D. Nguyen

(57) ABSTRACT

A printed circuit board and a manufacturing method thereof are disclosed. The method of manufacturing a printed circuit board can include: forming surface roughness on an insulation layer, coating a chemical compound onto the insulation layer that lowers the surface energy of the insulation layer, and forming a circuit pattern by inkjet printing on the insulation layer coated with the chemical compound. Certain embodiments of the invention can be utilized to improve adhesive strength between the insulation layer and the inkjet-printed circuit patterns, suppress spreading in the inkjet-printed circuit patterns to improve resolution, and reduce manufacturing costs by forming the circuits using inkjet printing.

8 Claims, 12 Drawing Sheets

METHOD OF MANUFACTURING A PRINTED CIRCUIT BOARD

CROSS-REFERENCE TO RELATED APPLICATIONS

This application claims the benefit of Korean Patent Application No. 10-2008-0043201 filed with the Korean Intellectual Property Office on May 9, 2008, the disclosure of which is incorporated herein by reference in its entirety.

BACKGROUND

1. Technical Field

The present invention relates to a printed circuit board and a method of manufacturing the printed circuit board.

2. Description of the Related Art

The processes for forming circuits on a printed circuit board, used in manufacturing electronic equipment, may entail a number of complicated processes, such as fabricating a mask, exposing to ultraviolet rays, developing, etching, stripping, cleansing, and drying.

Recently, the demands have increased for inexpensive methods of manufacturing electronic equipment, spurred by trends towards providing electronic equipment in lower costs. There has also been an increase in the demands for establishing an environment-friendly manufacturing process, such as by reducing the use of organic solvents hitherto used in large quantities in the processes for developing, etching, stripping, and cleansing, etc. Accordingly, digital manufacturing processes, such as those employing inkjet printing, are currently receiving much attention.

In general, the circuit wiring in a printed circuit board for manufacturing electronic equipment was formed by attaching copper foils over an insulation layer made of an epoxy resin composition and then forming a pattern by etching the unnecessary portions.

In the case of a package substrate intended for mounting semiconductor chips, higher levels of thermal resistance and reliability may be required, compared to a substrate for a regular printed circuit board. Thus, the substrate was manufactured using an insulation layer made from an epoxy composition, which has a high glass transition temperature, or using a BT resin containing a bismaleimide triazine (BT) compound for the interlayer insulation material.

However, thermosetting resins having high thermal resistance, such as BT resin, may provide low adhesion to metals, such as copper, forming the conductive layer. As such, delamination may occur between the insulation layer and the metal wiring layer while performing reliability evaluation procedures such as thermal impact tests.

A method of forming a thin layer of adhesive between the insulation layer and the copper foil was proposed to resolve this problem, but because of the moisture absorption by the adhesive layer formed between the insulation layer and the copper foil, the desired levels of adhesive strength and thermal resistance may not be obtained.

Also, in accordance with the trends of decreasing costs in current electronic equipment, there is an increasing demand for low-cost manufacturing processes, and there have been numerous attempts to introduce digital manufacturing processes, such as inkjet processes, to processes for forming circuit wiring in a printed circuit board.

In cases where the circuit wiring for a printed circuit board is formed using an inkjet process, the previous processes for fabricating a mask, exposing, developing, etching, stripping, and cleansing can be substituted by the inkjet printing and curing processes, allowing vast savings in manufacturing costs.

Moreover, the large quantities of organic solvents and organic waste involved in wet processes can be avoided, whereby a more environment-friendly manufacturing process may be established.

However, when manufacturing a thermally resistant package substrate using inkjet processes, the circuit wiring may not be formed with high reliability, due to the low adhesive strength between the BT resin and the nanometal ink printed on the BT resin.

Attempts have been made to resolve this problem by laminating a thin adhesive layer over the BT resin and forming the wiring by inkjet printing over the adhesive layer. However, the different rates of contraction and expansion between the metal and adhesive layers can lead to cracking in the metal wiring during the curing of the nanometal, and thus such attempts may not be applied to actual manufacturing processes.

Thus, in order to form wiring lines on a thermosetting resin high in thermal resistance using a digital manufacturing process such as an inkjet printing process, sufficient adhesive strength is needed between the thermally resistant substrate material, such as BT resin, and the printed nanometal ink. Furthermore, there is also a need for a technique that allows the forming of fine-line wiring to implement the high level of integration in a package substrate.

SUMMARY

An aspect of the invention is to provide a printed circuit board and a method of manufacturing the printed circuit board, which can improve the adhesive strength between the insulation layers and inkjet-printed circuit patterns and which can suppress spreading in the inkjet-printed circuit patterns to offer higher resolution.

One aspect of the invention provides a method of manufacturing a printed circuit board, where the method includes: forming surface roughness on an insulation layer, coating a chemical compound onto the insulation layer that lowers the surface energy of the insulation layer, and forming a circuit pattern by inkjet printing on the insulation layer coated with the chemical compound.

Here, the insulation layer can be made from a BT (bismaleimide triazine) resin.

The operation of forming the surface roughness can include: providing a copper foil having surface roughness, hot pressing the copper foil onto the insulation layer, and removing the copper foil stacked on the insulation layer.

The surface roughness on the copper foil can be formed by micro etching, and the hot pressing can be performed at a temperature of 150 to 250° C. with a pressure of 3 to 8 MPa.

The chemical compound can include any one of a fluorine compound and a silicon compound, while the silicon compound may be selected from a group consisting of dimethyl polysiloxane, phenylmethyl polysiloxane, polydimethyl siloxane, vinyl silane, and acrylate silane.

The method of manufacturing a printed circuit board may further include, after the operation of forming the circuit pattern, curing the insulation layer on which the circuit pattern is formed at a temperature below 300° C.

Another aspect of the invention provides a printed circuit board that includes: an insulation layer on which surface roughness is formed, a chemical compound coated on the insulation layer to lower the surface energy of the insulation layer, and a circuit pattern formed by inkjet printing on the insulation layer coated with the chemical compound.

Here, the insulation layer can be made from a BT (bismaleimide triazine) resin, while the chemical compound can include any one of a fluorine compound and a silicon compound.

The silicon compound may be selected from a group consisting of dimethyl polysiloxane, phenylmethyl polysiloxane, polydimethyl siloxane, vinyl silane, and acrylate silane.

Additional aspects and advantages of the present invention will be set forth in part in the description which follows, and in part will be obvious from the description, or may be learned by practice of the invention.

DETAILED DESCRIPTION

Figure 1:
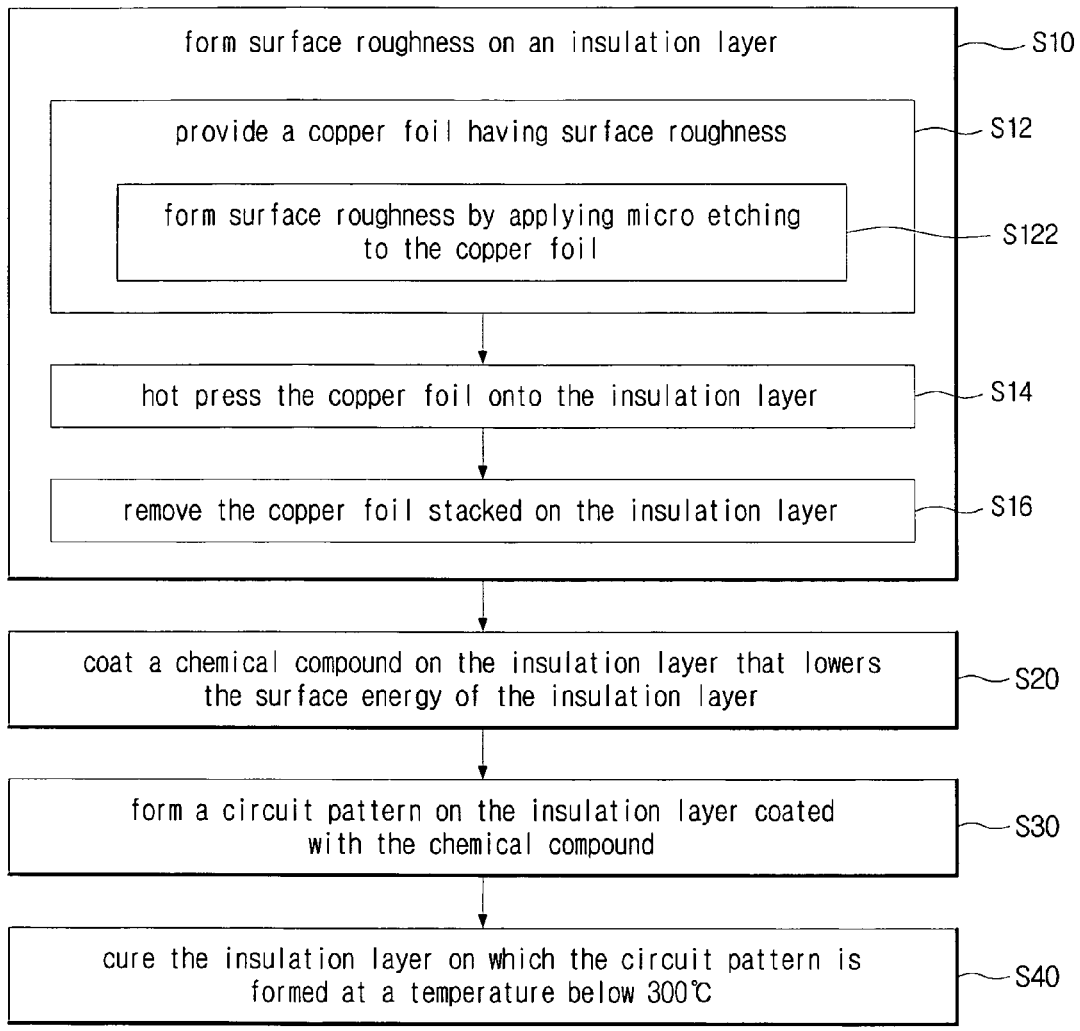
FIG. 1 is a flowchart illustrating a method of manufacturing a printed circuit board according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The printed circuit board and method of manufacturing the printed circuit board according to certain embodiments of the invention will be described below in more detail with reference to the accompanying drawings. Those components that are the same or are in correspondence are rendered the same reference numeral regardless of the figure number, and redundant explanations are omitted.

FIG. 1 is a flowchart illustrating a method of manufacturing a printed circuit board according to an embodiment of the invention, while FIG. 2 through FIG. 10 are cross sectional views representing a flow diagram for a method of manufacturing a printed circuit board according to an embodiment of the invention.

In FIGS. 2 to 10, there are illustrated copper foils 10, surface-roughened copper foils 12, detaching material 14, an insulation layer 20, a fluorine or silicon compound 30, and a circuit pattern 40.

In this embodiment, surface roughness can be formed on an insulation layer 20, and a chemical compound 30 that lowers the surface energy of the insulation layer 20 can be coated on the insulation layer 20, after which a circuit pattern 40 can be formed by inkjet printing over the insulation layer 20 coated with the chemical compound 30. With this embodiment, the adhesive strength between the insulation layer 20 and the inkjet-printed circuit pattern 40 can be improved, and the spreading of the inkjet-printed circuit pattern 40 can be suppressed, whereby the printing resolution may be enhanced.

Figure 2:
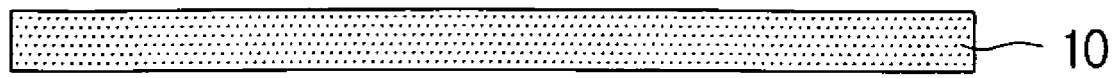
FIG. 2, FIG. 3, FIG. 4, FIG. 5, FIG. 6A, FIG. 6B, FIG. 7, FIG. 8, FIG. 9, and FIG. 10 are cross sectional views representing a flow diagram for a method of manufacturing a printed circuit board according to an embodiment of the invention.

First, as illustrated in FIG. 2, a copper foil 10 can be prepared. A copper foil generally used in manufacturing a printed circuit board may include a smooth "shine" surface and a relatively rougher "mat" surface.

The shine surface may be the surface that is directly assailed when forming the circuits of a printed circuit board by etching. By applying a micro etching treatment to the shine surface under various conditions, a roughened surface can be obtained with varying degrees of roughness.

The mat surface of the copper foil may be fabricated with a roughening treatment to increase the adhesive strength between the copper foil and the resin surface when manufacturing a copper clad laminate. The copper foil is commercially available with varying degrees of roughness.

Figure 3:
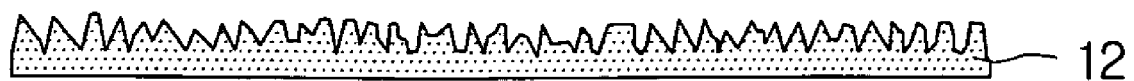

Using the method described above, a surface-roughened copper foil 12 may be provided (S12), as illustrated in FIG. 3. Here, the mat surface of the copper foil 12 may have been roughened beforehand and thus may be used as is. To the shine surface of the copper foils 12, surface roughness can be formed by applying a micro etching treatment (S122).

Figure 4:
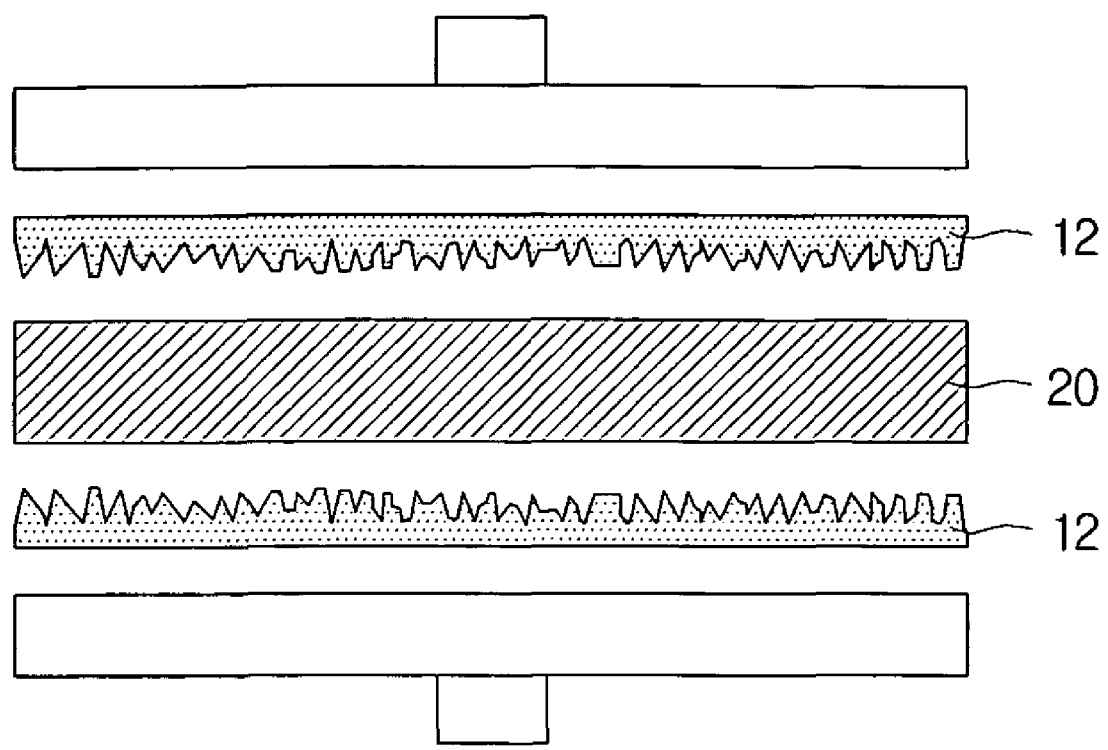
Figure 5:
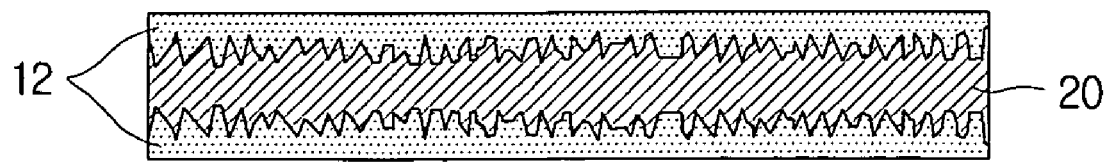

Next, as illustrated in FIGS. 4 and 5, the copper foils 12 can be hot pressed onto an insulation layer 20 (S14).

The insulation layer 20 can be made from a BT (bismaleimide triazine) resin. The BT resin may have a higher glass transition temperature compared to epoxy resin generally used in manufacturing substrates. As such, the BT resin may not be disintegrated or deformed even when the temperature is raised to 200° C. to cure the inkjet-printed nanometal. It may also be advantageously used in manufacturing products that require high thermal resistance and high reliability, such as package printed circuit boards for mounting semiconductors.

In order to form roughened surfaces on the BT resin by pressing the surface-roughened copper foils 12 into the insulation layer 20, an unhardened BT prepreg may be used. This is because it may be difficult to form rough surfaces in fully hardened BT resin, due to the three-dimensionally solid bonds shared by the polymers within the BT resin.

The pressing of the BT insulation layer 20 using the copper foils 12 may continue until the BT insulation layer 20 is sufficiently hardened to be thermally stable. The hot pressing of the BT insulation layer 20 may be performed at a temperature of 150 to 250° C. under a pressure of 3 to 8 MPa for 30 to 200 minutes.

Here, if the insulation layer 20 made from a BT resin does not harden under the above conditions, there is a risk that the BT resin may contract during the sintering procedure described below for the nanometal ink, whereby cracks, etc., may be created in the printed circuit pattern 40.

Figure 6A:
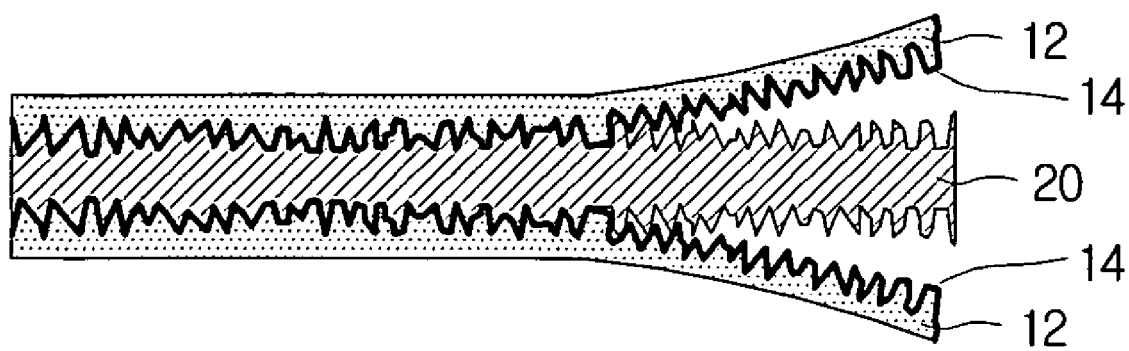
Figure 6B:
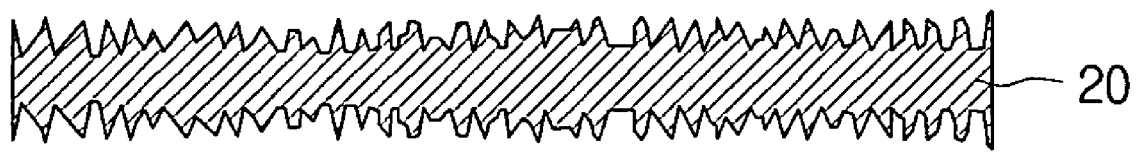

Next, as illustrated in FIGS. 6A and 6B, the copper foils 12 stacked on the insulation layer 20 can be removed (S16). The method of removing the copper foils 12 may include laminating a detaching material 14 onto the copper foils 12 before pressing, so that the copper foils 12 may readily be removed after the copper foils 12 are pressed onto the insulation layer 20, as in the example shown in FIG. 6A.

Alternately, as in the example shown in FIG. 6B, the copper foils 12 pressed into the insulation layer 20 may be removed using an etching process.

Figure 7:

In this way, an insulation layer 20 having surface roughness can be formed (S10), as illustrated in FIG. 7. By thus forming surface roughness on the insulation layer 20, the adhesive strength of the nanometal ink printed on the BT resin can be increased. That is, when the nanometal ink is printed onto the insulation layer 20 and hardened, a strong mechanical interlock may be formed with the roughened surface of the insulation layer 20, whereby high adhesive strength may be obtained.

However, applying a surface roughening treatment to the insulation layer 20 may increase the surface area of the insulation layer 20, and due to the spreading of the printed ink, the resolution of the printed ink may be degraded. Here, a surface roughening treatment refers to forming surface roughness on the insulation layer 20.

Figure 8:
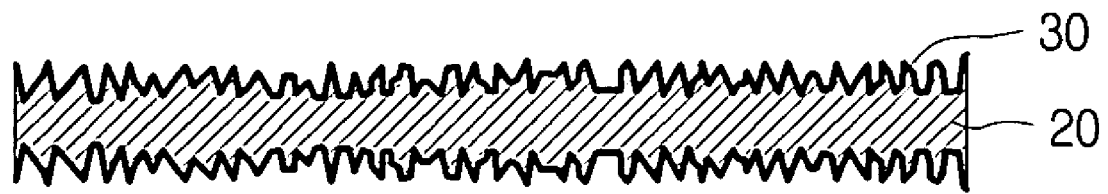

To prevent the problem stated above, a chemical compound 30 that lowers the surface energy of the insulation layer 20 can be coated on the insulation layer 20 (S20), as illustrated in FIG. 8. To be more specific, performing inkjet printing onto a BT insulation layer 20 having surface roughness can provide higher adhesive strength between the insulation layer 20 and the circuit pattern 40.

However, due to the increased surface energy of the insulation layer 20, the nanometal ink ejected from the inkjet head may spread widely over the BT insulation layer 20 and thus provide a lower resolution. Therefore, in this embodiment, the roughened surfaces of the BT insulation layer 20 can be chemically treated using a fluorine or silicon compound, etc.

Thus, the surface energy of the roughened BT insulation layer 20 can be lowered, so that the spreading may be lessened when the nanometal is printed, making it possible to provide a high level of printing resolution and form fine-line wiring.

Examples of silicon compounds that can be used include dimethyl polysiloxane, phenylmethyl polysiloxane, polydimethyl siloxane, vinyl silane, and acrylate silane.

The method of coating the insulation layer 20 having surface roughness with a fluorine or silicon compound may include laminating the chemical compound 30 over the insulation layer 20 or immersing the insulation layer 20 into a solution containing the chemical compound 30.

Although forming an inkjet-printed circuit pattern 40 after forming surface roughness on the insulation layer 20 may increase the surface area and thus increase the spreading of printed ink, the surface energy of the insulation layer 20 may be lowered by applying a chemical treatment to the roughened surfaces of the insulation layer 20. In this way, the spreading of the printed ink can be suppressed, whereby the resolution can be improved and a fine-line circuit pattern 40 can be implemented.

Figure 9:
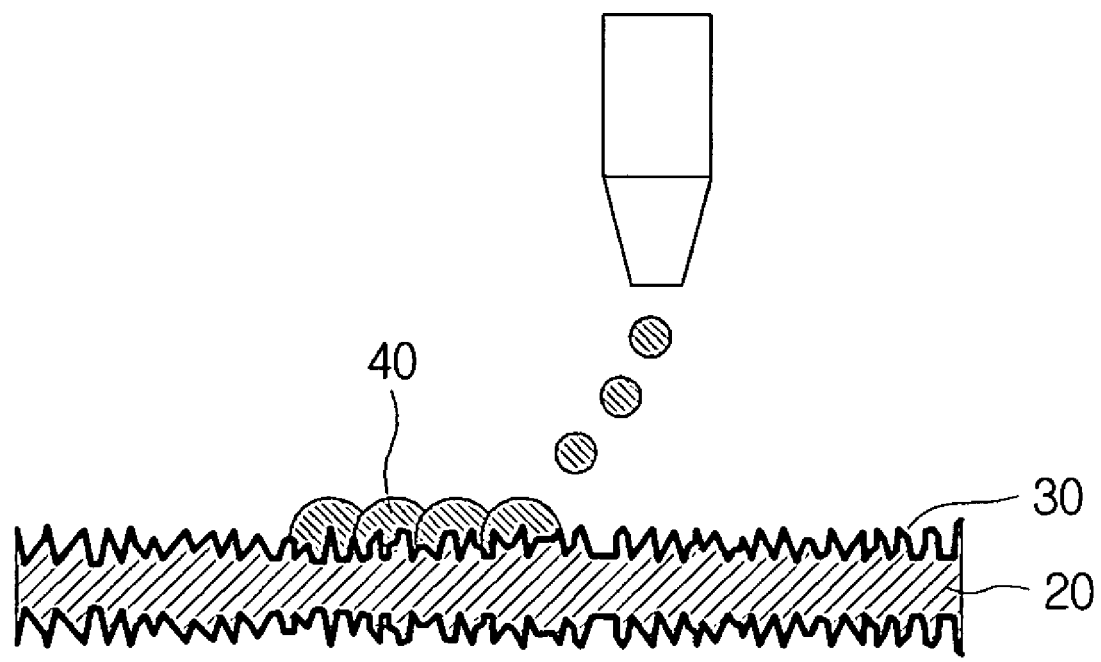

Next, as illustrated in FIG. 9, a circuit pattern 40 can be formed, by inkjet printing, on the insulation layer 20 coated with a fluorine compound or silicon compound (S30).

In this particular embodiment, conductive wiring lines may be formed by inkjet printing ink that contains metal particles having sizes of 100 nm or smaller.

In general, if the sizes of metal particles are smaller than 100 nm, the relative surface area of the particles may be greatly increased, whereby the particles may exhibit properties different from regular metal particles. In particular, the fusion point of the metal particles may be greatly lowered, and fusion may begin at about 200° C., making it possible to perform sintering at around this temperature.

Moreover, the electrical conductivity of the cured metal pattern may be similar to the electrical conductivity of bulk metal, so that the wiring lines may readily be formed on the polymer insulation layer 20, which is generally vulnerable to heat.

Figure 10:
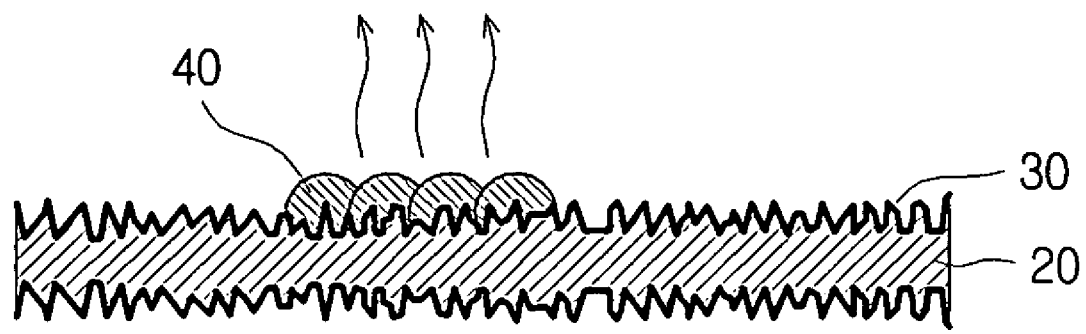

Thus, as illustrated in FIG. 10, the insulation layer 20 on which the circuit pattern 40 is formed can be cured at a temperature below 300° C. (S40).

Examples of metal particles that can be used include gold, silver, copper, platinum, palladium, nickel, etc., where the average diameter of the particles can be between 1 and 100 nm.

Inkjet printing is a technique by which a pattern may be formed by directly printing the pattern according to the design data, and is a revolutionary method that makes it possible to omit the mask-fabricating, laminating, exposing, developing, etching, and stripping processes necessary in conventional photolithography processes.

In addition, the amounts of organic solvents and organic waste involved can be reduced, whereby manufacturing costs may be decreased. Furthermore, the omission of existing processes may not only offer reduced costs but also eliminate potential causes of defects that would otherwise be created by the omitted processes, so that products may be manufactured with higher quality.

Figure 11:
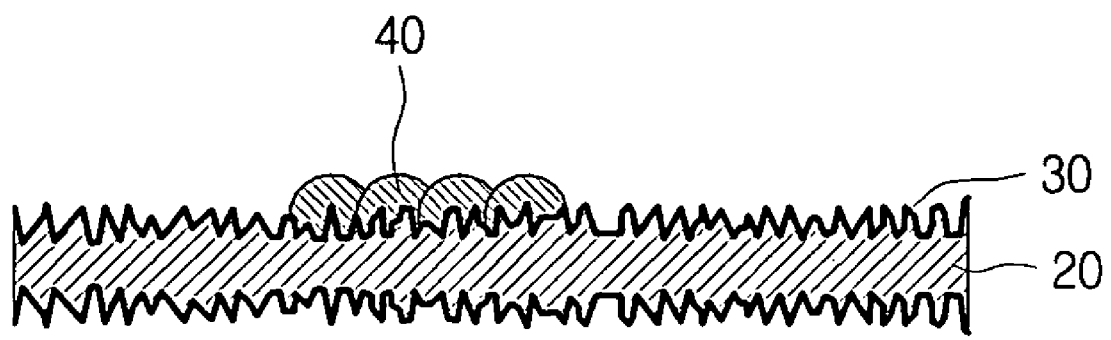
FIG. 11 is a cross sectional view illustrating a printed circuit board according to an embodiment of the invention.

FIG. 11 is a cross sectional view illustrating a printed circuit board according to an embodiment of the invention. In FIG. 11, there are illustrated an insulation layer 20, a fluorine or silicon compound 30, and a circuit pattern 40.

The surfaces of the insulation layer 20 can be roughened, so that when the circuit pattern 40 is formed by inkjet printing, the mechanical bonding between the surface of the insulation layer 20 and the circuit pattern 40 may be improved.

Here, the insulation layer 20 can be made from a BT resin. The BT resin may have a higher glass transition temperature compared to epoxy resin generally used in manufacturing substrates, and as such, may not be disintegrated or deformed even when the temperature is raised to 200° C. for curing the inkjet-printed nanometal. It may also be advantageously used in manufacturing products that require high thermal resistance and high reliability, such as package printed circuit boards for mounting semiconductors.

In order to lower the surface energy of the insulation layer 20 having surface roughness, a fluorine-based or silicon-based chemical compound 30 can be coated on. That is, the surface energy of the surface-roughened BT insulation layer 20 can be lowered to provide less spreading when the nanometal is printed, and thereby allow a higher printing resolution, as well as finer circuit wiring.

Here, the silicon compound can include one or more selected from a group consisting of dimethyl polysiloxane, phenylmethyl polysiloxane, polydimethyl siloxane, vinyl silane, and acrylate silane.

The circuit pattern 40 can be formed by inkjet printing on the insulation layer 20 that is coated with the chemical compound 30. The circuit pattern 40 can exhibit increased adhesion to the insulation layer 20 having surface roughness, while the chemical compound 30 that lowers surface energy can reduce the spreading of the printed ink and thus enhance resolution.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board, the method comprising:
    forming surface roughness on an insulation layer such that adhesive strength between the insulation layer and a nanometal ink is increased;
    coating a chemical compound onto the roughed surface of the insulation layer, the chemical compound configured to lower a surface energy of the insulation layer such that spreading of the nanometal ink on the insulation layer is decreased; and
    forming a circuit pattern by inkjet printing the nanometal ink on the chemical pound that had been coated onto the insulation layer.

2. The method of claim 1, wherein the insulation layer comprises a BT (bismaleimide triazine) resin.

3. The method of claim 1, wherein the forming of the surface roughness comprises:
    providing a copper foil having surface roughness;
    hot pressing the copper foil onto the insulation layer; and
    removing the copper foil stacked on the insulation layer.

4. The method of claim 3, wherein the surface roughness on the copper foil is formed by micro etching.

5. The method of claim 3, wherein the hot pressing is performed at a temperature of 150 to 250° C. with a pressure of 3 to 8 MPa.

6. The method of claim 1, wherein the chemical compound comprises any one of a fluorine compound and a silicon compound.

7. The method of claim 6, wherein the silicon compound comprises any one or more selected from a group consisting of dimethyl polysiloxane, phenylmethyl polysiloxane, polydimethyl siloxane, vinyl silane, and acrylate silane.

8. The method of claim 1, further comprising, after the forming of the circuit pattern:
    curing the insulation layer having the circuit pattern formed thereon at a temperature below 300° C.

* * * * *

UNITED STATES PATENT AND TRADEMARK OFFICE
CERTIFICATE OF CORRECTION

PATENT NO. : 8,215,010 B2
APPLICATION NO. : 12/320742
DATED : July 10, 2012
INVENTOR(S) : Sung-Il Oh et al.

Page 1 of 1

It is certified that error appears in the above-identified patent and that said Letters Patent is hereby corrected as shown below:

Title Page, Item (75) (Inventors), Line 1, delete "Sung-II Oh," and insert -- Sung-Il Oh, --, therefor.
Column 7, Line 16 (Approx.), In Claim 1, delete "chemical pound" and insert -- chemical compound --, therefor.

Signed and Sealed this
Sixteenth Day of October, 2012

David J. Kappos
*Director of the United States Patent and Trademark Office*